United States Patent
Yamada et al.

(10) Patent No.: US 7,763,568 B2
(45) Date of Patent: Jul. 27, 2010

(54) METHOD FOR PRODUCING MGB$_2$ SUPERCONDUCTOR AND MGB$_2$ SUPERCONDUCTOR

(75) Inventors: Hideyuki Yamada, Nagoya (JP);
Nobuhito Uchiyama, Nagoya (JP);
Hiroaki Kumakura, Tsukuba (JP);
Hitoshi Kitaguchi, Tsukuba (JP);
Akiyoshi Matsumoto, Tsukuba (JP)

(73) Assignees: National Institute for Materials Science, Ibaraki (JP); Central Japan Railway Company, Aichi (JP)

( * ) Notice: Subject to any disclaimer, the term of this patent is extended or adjusted under 35 U.S.C. 154(b) by 161 days.

(21) Appl. No.: 12/071,354

(22) Filed: Feb. 20, 2008

(65) Prior Publication Data

US 2008/0274902 A1    Nov. 6, 2008

(30) Foreign Application Priority Data

Feb. 21, 2007    (JP)    ............... 2007-041469

(51) Int. Cl.
*H01L 39/24* (2006.01)
(52) U.S. Cl. .................. 505/430; 29/599; 501/96.1; 501/96.3; 501/108
(58) Field of Classification Search ................ 501/96.1, 501/96.3, 108; 420/402, 901; 423/155, 289
See application file for complete search history.

(56) References Cited

U.S. PATENT DOCUMENTS

2004/0121915 A1*    6/2004    Tanaka et al. ............... 505/100

OTHER PUBLICATIONS

S. X. Dou et al., "*Superconductivity, critical current density, and flux pinning in MgB$_{2-x}$ (SiC)$_{x/2}$ superconductor after SiC nanoparticle doping*", Journal of Applied Physics, vol. 94, No. 3, pp. 1850-1856 (2003).

H. Yamada et al., "*Effect of aromatic hydrocarbon addition on in situ powder-in-tube process MgB$_2$ tapes*", Superconductor Science and Technology, vol. 19, pp. 175-177 (2006).

H. Yamada et al., "*The excellent superconducting properties of in situ powder-in-tube processed MgB$_2$ tapes with both ethyltoluene and SiC powder added*", Superconductor Science and Technology, vol. 20, pp. L30-L33 (2007).

* cited by examiner

*Primary Examiner*—Stanley Silverman
*Assistant Examiner*—Paul A Wartalowicz
(74) *Attorney, Agent, or Firm*—Wenderoth, Lind & Ponack, L.L.P.

(57) ABSTRACT

The present invention provides a method for producing a MgB$_2$ superconductor, comprising compacting and heating a mixture comprising Mg or MgH$_2$ powder and B powder, wherein said mixture comprises SiC powder and an aromatic hydrocarbon, and a MgB$_2$ superconductor having a higher critical current density ($J_c$) than that of the known MgB$_2$ superconductors added SiC only or added an aromatic hydrocarbon only such as benzene.

4 Claims, 1 Drawing Sheet

METHOD FOR PRODUCING MGB$_2$ SUPERCONDUCTOR AND MGB$_2$ SUPERCONDUCTOR

CROSS-REFERENCE TO RELATED APPLICATION

This application claims, under 35 USC 119, priority of Japanese Patent Application No. 2007-041469, filed Feb. 21, 2007, disclosures of which, inclusive of the specification, claims and drawings, are hereby incorporated by reference herein.

TECHNICAL FIELD

The present invention relates to a method for producing a MgB$_2$ superconductor and to a MgB$_2$ superconductor. More specifically, the present invention is directed to a method for producing an MgB$_2$ superconductor having a high critical current density ($J_c$) useful for application to, for example, a superconducting linear motor car, an MRI medical diagnosis apparatus, a semiconductor single crystal pulling apparatus, a superconducting energy storage apparatus, a superconducting rotating machine, a superconducting transformer, and a superconducting cable, and to a MgB$_2$ superconductor produced by the above method.

BACKGROUND ART

Because an MgB$_2$ superconductor, which was discovered in Japan in 2001, has the highest superconducting critical temperature (39 K) among the known metal-based superconductors, and because it is relatively easy to form the MgB$_2$ superconductor in a bulk or wire material, many studies have been made all over the world on the development of bulk or wire MgB$_2$ superconductors. A method of manufacturing the bulk materials generally includes compacting a mixed powder of Mg or MgH$_2$ powder and B powder under pressure and heat-treating (sintering) the compacted product. One major method for forming the superconducting wire is a powder-in-tube method in which a mixture of Mg or MgH$_2$ powder and B powder is filled in a metal tube, followed by rolling and a heat treatment. The critical current density ($J_c$) of the bulk or wire material produced by the known powder-sintering method or powder-in-tube method is about 3,000 A/cm$^2$ at 4.2K and 10 T, and about 700 A/cm$^2$ at 4.2K and 10 T and, thus, is not very high.

With a view toward improving the critical current density ($J_c$) of MgB$_2$ superconductors an attempt has been made to incorporate an additive into a mixture of Mg or MgH$_2$ powder and B powder. For example, addition of SiC powder having a particle size at the nanometer level (10 nm to 100 nm) is reported to be effective to obtain an improvement of the critical current density ($J_c$) (S. X. Dou, et al., Journal of Applied Physics 94 (2003), 1850 (Non-Patent Document 1); H. Yamada et al., Journal of Applied Physics 19 (2006), 175 (Non-Patent Document 2); and H. Yamada et al., Journal of Applied Physics 20 (2007), 1 (Non-Patent Document 3)). Further, Non-Patent Document 2 discloses that an aromatic hydrocarbon, particularly benzene, is effective to improve the critical current density ($J_c$) of an MgB$_2$ superconductor.

However, the critical current density ($J_c$) of the MgB$_2$ superconductor obtained from a mixture of Mg powder or MgH$_2$ powder, B powder and SiC is at most about 22,000 A/cm$^2$ at 4.2K and 10 T, and about 10,000 A/cm$^2$ at 10 T. On the other hand, the critical current density ($J_c$) of the MgB$_2$ superconductor obtained from a mixture of Mg powder or MgH$_2$ powder, B powder and benzene is at most about 13,000 A/cm$^2$ at 4.2K and 10 T, and about 4,000 A/cm$^2$ at 10 T. In this circumstance, there is a strong demand for an MgB$_2$ superconductor having a higher critical current density ($J_c$).

SUMMARY OF THE INVENTION

It is, therefore, an object of the present invention to provide a method which can produce an MgB$_2$ superconductor having a higher critical current density ($J_c$) than that of the known MgB$_2$ superconductors added SiC only or added an aromatic hydrocarbon only such as benzene. Another object of the present invention to provide an MgB$_2$ superconductor having a higher critical current density ($J_c$) than that of the known MgB$_2$ superconductors.

In accomplishing the above objects, the present invention is as follows, the first invention provides a method for producing a MgB$_2$ superconductor, comprising compacting and heating a mixture comprising Mg or MgH$_2$ powder and B powder, wherein said mixture comprises SiC powder and an aromatic hydrocarbon.

The second invention provides a method as recited in the first invention, wherein the aromatic hydrocarbon is ethyltoluene.

The third invention provides a method as recited in the first invention, wherein the SiC powder has an average particle size of 10 to 30 nm.

The fourth invention provides a method as recited in the first invention, wherein said mixture has a content of the SiC powder of 5 to 30 mol % based on the theoretical amount of MgB$_2$ to be produced.

The fifth invention provides a method as recited in the first invention, wherein the mixture is filled in a metal tube prior to compacting and heating.

The sixth invention provides a MgB$_2$ superconductor produced by a method according to the first invention, which is a MgB$_2$ superconducting wire comprising one or a plurality of cores of a MgB$_2$.

The seventh invention provides a MgB$_2$ superconductor according to the sixth invention, which is a multi-core MgB$_2$ superconducting wire comprising a plurality of cores of a MgB$_2$.

It has been unexpectedly found that conjoint use of SiC powder and an aromatic hydrocarbon according to the first and second inventions gives a synergetic effect; i.e. when both SiC powder and an aromatic hydrocarbon are added to a raw mixture of Mg or MgH$_2$ powder and B powder, an MgB$_2$ superconductor having a significantly higher critical current density ($J_c$) than the critical current density ($J_c$) of 15,000 A/cm$^2$ at 4.2 K, 10 T that attained using a raw mixture of Mg or MgH$_2$ powder, B powder and SiC powder only, is obtained.

The MgB$_2$ superconductor that has a feature structure of multi-core MgB$_2$ wire rod with two or more MgB$_2$ cores can be manufactured according to the seventh invention, and it can be applied to the transformer etc. because of low AC loss.

BEST MODE FOR CARRYING OUT THE INVENTION

Figure 1:
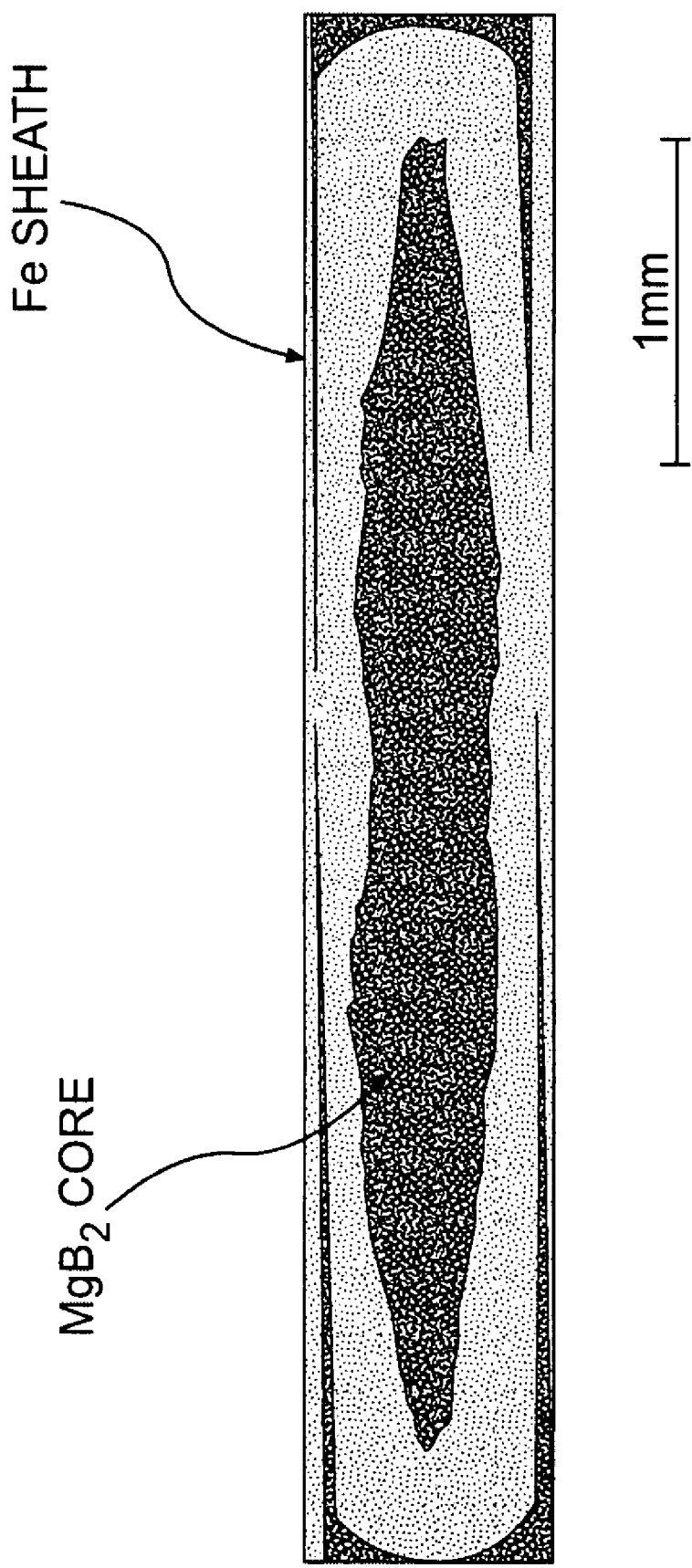
FIG. 1 is a cross-sectional view of a single core MgB$_2$ superconducting wire obtained in Example 1.

The invention of this application has the above-described features, and embodiments thereof are described in detail in the following.

The Mg or MgH$_2$ powder and B powder used as raw materials may have a purity level, a particle size and a blending ratio similar to those employed in the conventional method. Thus, the Mg or MgH$_2$ powder generally has an average particle size of 200 nm to 50 μm, while the B powder generally has an average particle size of 0.2 to 1 μm. The Mg or MgH$_2$ powder and B powder are generally used in such amounts that the molar ratio of the Mg or MgH$_2$ powder to the B powder (Mg/B or MgH$_2$/B) is in the range of 0.5:2 to 1.5:2, preferably 0.8:2 to 1.2:2.

It is preferred that the SiC powder have an average particle size of a nanometer level, more preferably 10 nm to 30 nm, and be used in an amount of 5 to 30 mol % based on the theoretical amount of MgB$_2$ to be produced (or on the empirical yield of MgB$_2$) for reasons of high critical current density ($J_c$). When the particle size of the SiC particles is excessively large, the critical current density ($J_c$) tends to be reduced from the maximum value, though an improvement of the critical current density ($J_c$) is still obtainable. This also applies to the amount of SiC used.

The aromatic hydrocarbon may be a compound having a monocyclic or polycyclic aromatic ring or a heterocyclic ring. The number of carbon atoms of the aromatic hydrocarbon is not specifically limited but is generally in the range of 4 to 20. The aromatic hydrocarbon may have one or more substituent groups as long as the operation and effect of the invention are not inhibited, and may be suitably selected with consideration of the availability, handling, price, etc. Representative examples of the aromatic hydrocarbon include benzene, naphthalene, anthracene, perylene, biphenyl, and heterocyclic aromatic hydrocarbons such as thiophene. Typical examples of such substituents, for example, include alkyl groups having 1 to 8 carbon atoms, particularly 1 to 4 carbon atoms. Specifically, carbocyclic compound including benzene, naphthalene, anthracene, perylene, biphenyl and alkyl-substituted benzenes such as toluene, xylene and ethyltoluene (2-ethyltoluene, 3-ethyltoluene, 4-ethyltoluene and a mixture of two or more thereof) and hetero aromatic compound such as thiophene are presented. The aromatic hydrocarbon is generally used in an amount of 1 to 40 mol % based on the theoretical amount of MgB$_2$ to be produced (or on the empirical yield of MgB$_2$).

A blend of the Mg or MgH$_2$ powder, B powder, SiC powder and an aromatic hydrocarbon is thoroughly mixed using a suitable mixing device such as a ball mill. The resulting mixture is processed into a superconductor in the form of a bulk, wire, tape or any other desired form using any conventionally known method and conditions. In the case of a bulk material, for example, the mixture is pressure-compacted by press-molding in an ordinary mold at a pressure of 100-300 kg/cm$^2$, followed by a heat treatment. In the case of the wire, a metal tube such as an iron tube is filled with the mixture and is then processed to a tape or a wire by rolling or drawing, followed by a heat treatment. The heat treatment is performed under the customarily employed conditions, i.e. in the atmosphere of an inert gas such as argon or in a vacuum at a temperature and for a period of time sufficient to obtain an MgB$_2$ superconducting phase.

The superconductor according to the present invention is useful for application to, for example, superconducting linear motor cars, MRI medical diagnosis apparatuses, semiconductor single crystal pulling apparatuses, superconducting energy storage apparatuses, superconducting rotating machines, superconducting transformers, and superconducting cables.

The following examples and comparative examples will further illustrate the present invention. Of course, the present invention is never limited by the following examples.

EXAMPLES

Example 1

A commercially available MgH$_2$ powder (manufactured by Alfa Aesar, 325 mesh, purity: 98%) and a commercially available B powder (manufactured by Alfa Aesar, 325 mesh, purity: 99.99%) were blended in a 1:2 molar ratio, to which ethyltoluene and SiC (manufactured by Nanostructural Amorphous Metals Inc., an average particle size: up to 20 nm, purity: 97%) were added. This blend was placed in a ball mill pot made of tungsten carbide (WC) and milled for about 1 hour. The ethyltoluene and SiC were added in amounts shown in Table 1 (10 or 20 mol % in the case of ethyltoluene and 10 mol % in the case of SiC based on the theoretical amount of MgB$_2$ produced). The thus obtained mixture was filled in an iron tube having outer and inner diameters of 6 mm and 4 mm, respectively. The iron tube containing the mixture was rolled into a tape having a width of 4 mm and a thickness of 0.5 mm using groove-rolling and flat-rolling machines. The tape obtained was then heat-treated within a glove box at 600° C. for 1 hour under a flowing argon gas atmosphere (Experiments No. 1 and No. 2).

For the purpose of comparison, the above procedures were conducted in the same manner as described except that SiC was used without using ethyltoluene (Experiment No. 3; method of the above-described Non-Patent Documents 1 and 2), that ethyltoluene was used without using SiC (Experiment No. 4), that benzene was used without using SiC (Experiment No. 5; method of the above-described Non-Patent Document 2), or that neither ethyltoluene nor SiC was used (Experiment No. 6).

The wire obtained in Experiment No. 3 was analyzed by the X-ray diffraction. It was revealed that the a-axis length shrank, while the c-axis length did not change. This behavior is in conformity with that reported in Non-Patent Document 1 in which MgB$_2$ was prepared using SiC powder.

FIG. 1 is a photograph showing a cross-section of a wire obtained in Experiment No. 6.

The critical current density ($J_c$) of each of the obtained wires was measured in different magnetic fields at the liquid helium temperature (4.2K). The results are shown in Table 1.

TABLE 1

| Experiment No. | | | 1 | 2 | 3 | 4 | 5 | 6 | 7 | 8 | 9 |
|---|---|---|---|---|---|---|---|---|---|---|---|
| Remarks | | | *Ex | *Ex | *2 | *Com | *3 | *Com | *Ex | *4 | *Com |
| Additive | *1 | Name | *ET | *ET | — | *ET | *B | — | *ET | — | *ET |
| | | Amount (mol %) | 10 | 20 | — | 10 | 10 | — | 10 | — | 10 |
| | SiC | Amount (mol %) | 10 | 10 | 10 | — | — | — | 10 | 10 | — |

TABLE 1-continued

| Experiment No. | | 1 | 2 | 3 | 4 | 5 | 6 | 7 | 8 | 9 |
|---|---|---|---|---|---|---|---|---|---|---|
| | Average particle size (nm) | 20 | 20 | 20 | — | — | — | 20 | 20 | — |
| Jc ($10^3$ A/cm$^2$) at 4.2K | 7T | | | | | | 24.7 | | | |
| | 8T | | 49.1 | 32.0 | 40.0 | 33.1 | 12.9 | | 45.0 | 42.3 |
| | 9T | 45.9 | 34.6 | 22.0 | 22.7 | 19.5 | 6.6 | 45.0 | 32.0 | 26.8 |
| | 10T | 31.8 | 24.0 | 14.6 | 12.9 | 11.2 | 3.3 | 32.4 | 22.0 | 17.1 |
| | 11T | 21.6 | 16.0 | 9.7 | 7.2 | 6.2 | 1.6 | 23.3 | 15.0 | 10.6 |
| | 12T | 14.5 | 10.8 | 6.1 | 3.8 | 3.5 | 0.7 | 16.3 | 10.0 | 6.6 |

*1: Aromatic hydrocarbon
*2: Disclosed in Non-Patent Documents 1 and 2 (Reference Example)
*3: Disclosed in Non-Patent Document 2 (Reference Example)
*4: Disclosed in Non-Patent Document 3 (Reference Example)
*Ex: Inventive Example
*Com: Comparative Example
*ET: Ethyltoluene
*B: Benzene As can be seen from the results shown in Table 1, the critical current density ($J_c$) at 4.2K significantly changes by the presence or absence of ethyltoluene and SiC. Namely, the $J_c$ values at 4.2K in a magnetic field in the range of 9 T to 12 T of the wires of Experiments No. 1 and No. 2 in which both ethyltoluene and SiC are incorporated in the raw material mixture are much higher as compared with the other MgB$_2$ wires. In particular, the MgB$_2$ wires of Experiment No. 1 and No. 2 have about two times as high $J_c$ values as those of MgB$_2$ wires of Experiment No. 3 (using SiC only), and No. 5 (using benzene only) which wires have been alleged to have high ($J_c$) values. The MgB$_2$ wires of Experiment No. 1 and No. 2 also have much higher $J_c$ values than those of No. 4 (using ethyltoluene only).

According to Non-Patent Document 1, the improvement in the critical current density ($J_c$) by addition of SiC is described to be attributed to the formation of MgB$_{2-x}$C$_x$ as a result of substitution of part of B atoms of MgB$_2$ with C. Thus, the improvement in the critical current density ($J_c$) by addition of SiC in Experiment No. 3 is inferred to be ascribed to the formation of MgB$_{2-x}$C$_x$ as a result of substitution of part of B atoms of MgB$_2$ with C atoms. Also, the fact that the addition of benzene results in an improvement of the critical current density ($J_c$) is considered to be attributed to the substitution of part of B atoms with C atoms (Non-Patent Document 2).

The mechanism of the $J_c$ increase by the conjoint use of ethyltoluene and SiC as compared with the addition of SiC by itself (Non-Patent Documents 1 and 2) or the addition of benzene by itself (Non-Patent Document 2) is not clear at present, but it is evident that a synergetic effect of some nature occurs by the conjoint use.

Example 2

The procedures of Experiment No. 1 in Example 1 were conducted in the same manner as described except that thiophene was used in place of ethyltoluene. Thus, each of the thiophene and SiC was used in an amount of 10 mol % based on the theoretical amount of MgB$_2$ to be produced. The wire obtained was found to have a critical current density ($J_c$) of 6,800 A/cm$^2$ at 4.2K in a magnetic field of 12 T which value was greater than those of the wires obtained using thiophene by itself (4,000 A/cm$^2$), using SiC by itself (6,100 A/cm$^2$) and using benzene by itself (3,500 A/cm$^2$).

Example 3

The procedures of Experiment No. 1 in Example 1 were conducted in the same manner as described except that Mg powder (average particle size: 100 nm to 0.5 μm) was substituted for the MgH$_2$ powder to obtain an MgB$_2$ superconducting wire (experiment No. 7).

For the purpose of comparison, the above procedures of Experiment No. 7 were conducted in the same manner as described except that SiC was used by itself without using ethyltoluene (Experiment No. 8; method of the above-described Non-Patent Document 3) or that ethyltoluene was used by itself without using SiC (Experiment No. 9).

The critical current density ($J_c$) of each of the obtained wires was measured in different magnetic fields at the liquid helium temperature (4.2K). The results are shown in Table 1. From the results shown in Table 1, it is seen that the field dependence of critical current density ($J_c$) is similar in Examples 1 and 3 and that the present invention provides unexpectedly improved $J_c$ characteristics.

The invention may be embodied in other specific forms without departing from the spirit or essential characteristics thereof.

What is claimed is:

1. A method for producing a MgB$_2$ superconductor, comprising compacting and heating a mixture comprising Mg or MgH$_2$ powder and B powder, wherein said mixture further comprises SiC powder and ethyltoluene.

2. The method as recited in claim 1, wherein the SiC powder has an average particle size of 10 to 30 nm.

3. The method as recited in claim 1, wherein said mixture has a content of the SiC powder of 5 to 30 mol % based on the theoretical amount of MgB$_2$ to be produced.

4. The method as recited in claim 1, wherein the mixture is filled in a metal tube prior to compacting and heating.

\* \* \* \* \*